(12) United States Patent
Moore et al.

(10) Patent No.: US 6,996,660 B1
(45) Date of Patent: *Feb. 7, 2006

(54) MEMORY DEVICE AND METHOD FOR STORING AND READING DATA IN A WRITE-ONCE MEMORY ARRAY

(75) Inventors: Christopher S. Moore, San Jose, CA (US); James E. Schneider, Los Angeles, CA (US); J. James Tringali, Los Altos, CA (US); Roger W. March, Santa Clara, CA (US)

(73) Assignee: Matrix Semiconductor, Inc., Santa Clara, CA (US)

( * ) Notice: Subject to any disclaimer, the term of this patent is extended or adjusted under 35 U.S.C. 154(b) by 441 days.

This patent is subject to a terminal disclaimer.

(21) Appl. No.: 09/877,720

(22) Filed: Jun. 8, 2001

Related U.S. Application Data (60) Provisional application No. 60/282,723, filed on Apr. 9, 2001, provisional application No. 60/282,790, filed on Apr. 9, 2001.

(51) Int. Cl.
*G11C 7/00* (2006.01)
*G11C 11/34* (2006.01)

(52) U.S. Cl. .............. 711/102; 711/100; 711/103; 711/4; 711/154; 365/185.33; 365/185.29; 365/185.13; 365/185.14; 365/189.01; 365/234; 365/236; 365/185.15

(58) Field of Classification Search ........ 711/102–103, 711/4, 115, 100, 154; 714/746, 749; 365/185.33, 365/185.29, 185.13–185.15, 189.01, 234–236
See application file for complete search history.

(56) References Cited

U.S. PATENT DOCUMENTS 4,646,266 A 2/1987 Ovshinsky et al.

(Continued)

FOREIGN PATENT DOCUMENTS

EP 1 168 150 A1 2/2002

(Continued)

OTHER PUBLICATIONS

"New Direct CD 2.5 Improves Speed and Reliability of Data Archiving Using CD-R/CD-RW," http://www.adaptec.com/worl . . . pany/pressrelease.html?prodkey=08051998, 2 pages, Aug. 5, 1998.

(Continued)

*Primary Examiner*—B. James Peikari
*Assistant Examiner*—Zhuo H. Li
(74) *Attorney, Agent, or Firm*—Brinks Hofer Gilson & Lione (57) ABSTRACT

The preferred embodiments described herein provide a memory device and method for storing and reading data in a write-once memory array. In one preferred embodiment, a plurality of bits representing data is inverted and stored in a write-once memory array. When the inverted plurality of bits is read from the memory array, the bits are inverted to provide the data in its original, non-inverted configuration. By storing data bits in an inverted form, the initial, unprogrammed digital state of the memory array is redefined as the alternative, programmed digital state. Other preferred embodiments are provided, and each of the preferred embodiments described herein can be used alone or in combination with one another. For example, the embodiments in which data bits are inverted can be used alone or in combination with the embodiments in which data is redirected.

21 Claims, 9 Drawing Sheets

U.S. PATENT DOCUMENTS

| | | | |
|---|---|---|---|
| 4,682,318 A | | 7/1987 | Busby |
| 4,691,299 A | * | 9/1987 | Rivest et al. .......... 365/189.01 |
| 4,740,890 A | | 4/1988 | William |
| 5,029,125 A | | 7/1991 | Sciupac |
| 5,040,110 A | | 8/1991 | Miki et al. |
| 5,119,291 A | | 6/1992 | Flannagan et al. |
| 5,247,494 A | * | 9/1993 | Ohno et al. .............. 369/13.02 |
| 5,261,072 A | | 11/1993 | Siegel |
| 5,307,497 A | | 4/1994 | Feigenbaum et al. |
| 5,321,824 A | | 6/1994 | Burke et al. |
| 5,437,012 A | | 7/1995 | Mahajan |
| 5,437,028 A | | 7/1995 | Iijima |
| 5,448,728 A | | 9/1995 | Takano et al. |
| 5,457,796 A | | 10/1995 | Thompson |
| 5,463,772 A | | 10/1995 | Thompson et al. |
| 5,475,820 A | | 12/1995 | Natrasevschi et al. |
| 5,537,652 A | | 7/1996 | Friedl et al. |
| 5,559,778 A | | 9/1996 | Inokuchi et al. |
| 5,590,320 A | | 12/1996 | Maxey |
| 5,630,093 A | | 5/1997 | Holzhammer et al. |
| 5,752,005 A | | 5/1998 | Jones |
| 5,761,700 A | * | 6/1998 | Cozart et al. ............... 711/102 |
| 5,761,741 A | | 6/1998 | Robbins et al. |
| 5,832,263 A | | 11/1998 | Hansen et al. |
| 5,835,396 A | | 11/1998 | Zhang |
| 5,890,169 A | | 3/1999 | Wong et al. |
| 6,000,023 A | | 12/1999 | Jeon |
| 6,034,882 A | | 3/2000 | Johnson et al. |
| 6,055,180 A | | 4/2000 | Gudesen et al. |
| 6,073,208 A | * | 6/2000 | Norman ...................... 711/103 |
| 6,104,635 A | * | 8/2000 | Ogane ................... 365/185.08 |
| 6,138,203 A | | 10/2000 | Inokuchi et al. |
| 6,185,122 B1 | | 2/2001 | Johnson et al. |
| 6,236,587 B1 | | 5/2001 | Gudesen et al. |
| 6,341,085 B1 | | 1/2002 | Yamagami et al. |
| 6,345,333 B1 | * | 2/2002 | Sassa et al. ................. 711/103 |
| 6,351,838 B1 | | 2/2002 | Amelia |
| 6,370,642 B1 | | 4/2002 | Chiang et al. |
| 6,377,526 B1 | * | 4/2002 | Vining et al. .............. 369/53.1 |
| 6,424,581 B1 | | 7/2002 | Bosch et al. |
| 6,490,703 B1 | * | 12/2002 | de la Iglesia et al. ...... 714/746 |
| 6,563,745 B1 | * | 5/2003 | Ilkbahar ................ 365/189.07 |
| 6,584,541 B2 | | 6/2003 | Friedman et al. |
| 6,598,135 B1 | | 7/2003 | MacLeod |
| 6,631,107 B1 | | 10/2003 | Ito et al. |
| 6,647,471 B2 | | 11/2003 | March et al. |
| 6,658,438 B1 | | 12/2003 | Moore et al. |
| 6,667,939 B1 | | 12/2003 | Miyamoto |
| 6,772,274 B1 | | 8/2004 | Estakhri |
| 2002/0034105 A1 | | 3/2002 | Kulkarni et al. |
| 2002/0107862 A1 | | 8/2002 | Moore et al. |
| 2002/0108054 A1 | | 8/2002 | Moore et al. |
| 2003/0120858 A1 | | 6/2003 | March et al. |

FOREIGN PATENT DOCUMENTS

| | | | |
|---|---|---|---|
| EP | 1 331 548 A2 | | 7/2003 |
| EP | 1 359 500 A2 | | 11/2003 |
| JP | 07-045085 | * | 2/1995 |
| JP | 410283717 A | | 10/1998 |
| WO | WO 99/14763 | | 8/1998 |

OTHER PUBLICATIONS

"Universal Disk Format (UDF) Driver," http://www.trylinux.com/projects/udf/index.html, 3 pages (1999).

"FAT File Allocation Table," http://www.easydesksoftware.com/fat.htm, 2 pages, Oct. 24, 1999.

"FAT File Allocation Table," http://www.oreilly.com/reference/directory/terms/F/File Allocation_ Table.htm, 4 pages (1996).

"ISO9960 Simplified for DOS/Windows by Philip J. Erdelsky," http://www.alumni.caltech.edu/~pje/iso9660.html, 8 pages Aug. 26, 2000.

"Memory cards: designing with a full deck," http://www.ednmag.com/ednmag/reg/2000/052520000/11dfl.htm, 12 pages, May 25, 2000.

"DOS Disk Formats," http://www.qvctc.commnet.edu/classes/csc277/formats.html, 7 pages (1999).

"MS-DOS Partitioning Summary," http://www.qvctc.commnet.edu/classes/csc277/fdisk2.html, 3 pages (1999).

"DOS Partitions," http://www.qvctc.commnet.edu/classes/csc277/partitions.html, 5 pages (1999).

"DOS Disk Structures-Definitions," http://www.qvctc.commnet.edu/classes/csc277/formats2.html, 3 pages (1999).

"MS-DOS Summary A Survival Guide," http://www.washtenaw.cc.mi.us/dept/cis/mod/q02cd.htm, 10 pages (1996).

"Hardware White Paper, FAT: General Overview of On-Disk Format," Microsoft Corp., 25 pages, May 5, 1999.

"Method for Deleting Stored Digital Data from Write-Once Memory Device," U.S. Appl. No. 09/638,439, filed Aug. 14, 2000; inventors: Christopher S. Moore, Derek J. Bosch, Daniel C. Steere, and J. James Tringali.

"Method for storing Digital Information in Write-Once Memory Array," U.S. Appl. No. 09/727,229, filed Nov. 30, 2000; inventors: David R. Friedman Derek J. Bosch, Christopher S. Moore, J. James Tringali, and Michael A. Vyyoda.

"Three-Dimensional Memory Array and Method of Fabrication," U.S. Appl. No. 09/560,626, filed Apr. 28, 2000; inventor: Johan Knall.

"Write-Once Memory Array Controller, System, and Method," U.S. Appl. No. 09/638,427, filed Aug. 14, 2000; inventors: Derek J. Bosch, Christopher S. Moore, Daniel C. Steere, and J. James Tringali.

"Low-Cost Three-Dimensional Memory Array," U.S. Appl. No. 09/638,428, filed Aug. 14, 2000; inventors: Mark G. Johnson, Thomas H. Lee, Vivek Subramanian, and P. Michael Farmwald.

"Modular Memory Device," U.S. Appl. No. 09/638,334, filed Aug. 14, 2000; inventors: J. James Tringali, P. Michael Farmwald, Thomas H. Lee, Mark G. Johnson, and Derek J. Bosch.

"The MS-DOS Filesystem," http://www.cs.adfa.oz.au/teaching/studinfo/osrts/Lectures/node113.html, 2 pages Mar. 1, 2001.

"comp.os.ms-windows.programmer.vxd Frequently Asked Questions (FAQ)," http://www.faqs.org/faqs/windows/programming/vxd/, 16 pages (1995).

"CD-ROM Driver Installation Procedure," http://www.pcguide.com/proc/setup/cddriver-c.html, 3 pages, Apr. 17, 2001.

"Fujifilm News & Events, Medical Imaging Science Systems NDT Systems," http://www.fujimed.com/news/news_ openarch.html, 2 pages, Nov. 26, 2000.

"CNN.com DVD Encryption hacked," http://www.cnn.com/TECH/computing/9911/05/dvd,hack.idg/, 3 pages, Nov. 5, 1999.

"Octopus Systems, Acorn's Solution for the Java™ Technology Platform," http://www.octosys.co.uk/java.html, 9 pages (2001).

"Content Protection System Architecture, A Comprehensive Framework for Content Protection Intel Corp.," 19 pages, Feb. 17, 2000.

"Media security thwarts temptation, permits prosecution," http://www.ednmag.com/ednmag/reg/2000/06222000/13tt.htm, 13 pages, Jun. 22, 2000.

"Memory Devices and Methods for Use Therewith," U.S. Appl. No. 09/748,589, filed Dec. 22, 2000; inventors: Roger W. March, Christopher S. Moore, Daniel Brown, Thomas H. Lee, and Mark H. Johnson.

"Solid-State Memory Device Storing Program Code and Methods for Use Therewith," U.S. Appl. No. 09/775,745, filed Feb. 2, 2001; inventors: Christopher Moore, Roger March, and Dan Brown.

"Memory Device and Method for Reading Data Stored in a Portion of a Memory Device Unreadable by a File System of a Host Device," U.S. Appl. No. 09/775,939, filed Feb. 2, 2001; inventors: Christopher Moore, Roger March, and Dan Brown.

"Memory Device and Method for Storing and Reading a File System Structure in a Write-Once Memory Array," U.S. Appl. No. 09/877,719, filed Jun. 8, 2001; inventors: Christopher S. Moore, James E. Schneider, J. James Tringali, and Roger W. March.

"Method for Reading Data in a Write-Once Memory Device Using a Write-Many File System," U.S. Appl. No. 09/878,138, filed Jun. 8, 2001; Christopher S. Moore, J. James Tringali, Roger W. March, James E. Schneider, Derek J. Bosch, and Daniel C. Steere.

"Method for Re-Directing Data Traffic in a Write-Once Memory Device," U.S. Appl. No. 09/877,691, filed Jun. 8, 2001; inventors: J. James Tringali, Christopher S. Moore, Roger W. March, James E. Schneider, Derek J. Bosch, and Daniel C. Steere.

"Chapter 32—Disk Concepts and Troubleshooting," Microsoft Windows 2000 Professional Resource Kit, Microsoft Corporation, 28 pages, Mar. 15, 2000.

NN8803151, IBM Technical Disclosure Bulletin, "Incremental Directory Indexes for Write-Once Media", Mar., 1988, vol. 30, Issue 10, pp. 151-155.

"Exotic Memories, Diverse Approaches," EDN Asia, pp. 22-33 (Sep. 2001).

"A Vertical Leap for Microchips," Thomas H. Lee, Scientific American, 8 pages (Jan. 2002; printed Dec. 10, 2001).

"SmartMedia Physical Format Specifications Version 1.30," SSFDC Forum Technical Committee, 23 pages (May 19, 2000).

"SmartMedia Electrical Specifications Version 1.30," SSFDC Forum Technical Committee, 23 pages (May 19, 2000).

Press Release. "DataPlay, Inc.—What's Playing on DataPlay . . . Everything Digital!, " 2 Pages, Jan. 7, 2002.

"How Does TrueFFS Manage Wear Leveling," http://www.m-sys.com/content/information/calcInfo.asp, 2 pages, Oct. 2001.

"Datalight FlashFX 4.06," User's Guide, p. 11, Aug. 2000.

"How Flash Memory Works," http://howstuffworks.com/flash-memory.htm?printable=1, 5 pages, Sep. 2001.

"Flash Memory," Samsung Electronics, 39 pages, Jul. 2004.

"Media Security thawarts temptation, permits prosecution," http://www.ednmag.com/ednmag/reg/2000/06222000/13tt.htm, 13 pages, Jun. 22, 2000.

"Memory Devices and Methods for Use Therewith," U.S. Appl. No. 09/748,589, filed Dec. 22, 2000; inventors: Roger W. March, Christopher S. Moore, Daniel Brown, Thomas H. Lee, and Mark H. Johnson.

Danny Dolev et al.; Correcting faults in write-once memory; annual ACM Symposium on Theory of Computing archiveProceedings of the sixteenth annual ACM symposium on Theory of computing; pp.: 225-229; 1984; ☐☐ISBN:0-89791-122-4.

Ronald L. Rivest, Adi Shamir; How to reuse a "write-once" memory (Preliminary Version); May 1982; Proceedings of the fourteenth annual ACM symposium on Theory of computing; pp.: 105-113; ISBN:0-89791-070-2.

Zemor, G. and Cohen, G.D.: Error-correcting WOM-codes; Information Theory, IEEE Transactions on; May 1991; vol. 37 Issue: 3, Part 2; pp.: 730-734; ISSN: 0018-9448.

"Content Protection System Architecture, A Comprehensive Framework for Content Protection Intel Corp.," 19 pages, Feb. 17, 2000.

* cited by examiner

| Data | Written | No Data | A |
|---|---|---|---|
| • | • | • | |
| • | • | • | |
| • | • | • | |
| No Data | UnWritten | No Data | X |
| No Data | UnWritten | No Data | Y |
| No Data | UnWritten | No Data | Z |

*Fig. 11*

| Data | Over Written | Z | A |
|---|---|---|---|
| • | • | • | |
| • | • | • | |
| • | • | • | |
| No Data | UnWritten | No Data | X |
| No Data | UnWritten | No Data | Y |
| Updated Data | Written | No Data | Z |

*Fig. 12*

| Data | Over Written | Z | A |
|---|---|---|---|
| • | • | • | |
| • | • | • | |
| • | • | • | |
| No Data | UnWritten | No Data | X |
| Updated Data | Written | No Data | Y |
| Updated Data | Over Written | Y | Z |

MEMORY DEVICE AND METHOD FOR STORING AND READING DATA IN A WRITE-ONCE MEMORY ARRAY

RELATED APPLICATIONS

This application claims the benefit of U.S. Provisional Application No. 60/282,723, filed Apr. 9, 2001, and U.S. Provisional Application No. 60/282,790, filed Apr. 9, 2001, both of which are hereby incorporated by reference.

BACKGROUND

Non-volatile memory is becoming standard in consumer appliances such as digital cameras, digital audio players, and personal digital assistants. The demands for affordable non-volatile storage media coupled with the low cost per bit of information achievable in creating write-once storage elements have given rise to the proliferation of write-once memory devices in the consumer marketplace.

SUMMARY

The present invention is defined by the following claims, and nothing in this section should be taken as a limitation on those claims.

By way of introduction, the preferred embodiments described below provide a memory device and method for storing and reading data in a write-once memory array. In one preferred embodiment, a plurality of bits representing data is inverted and stored in a write-once memory array. When the inverted plurality of bits is read from the memory array, the bits are inverted to provide the data in its original, non-inverted configuration. By storing data bits in an inverted form, the initial, un-programmed digital state of the memory array is redefined as the alternative, programmed digital state. Other preferred embodiments are provided, and each of the preferred embodiments described herein can be used alone or in combination with one another. For example, the embodiments in which data bits are inverted can be used alone or in combination with the embodiments in which data is redirected.

The preferred embodiments will now be described with reference to the attached drawings.

DETAILED DESCRIPTION OF THE PRESENTLY PREFERRED EMBODIMENTS

Figure 1:
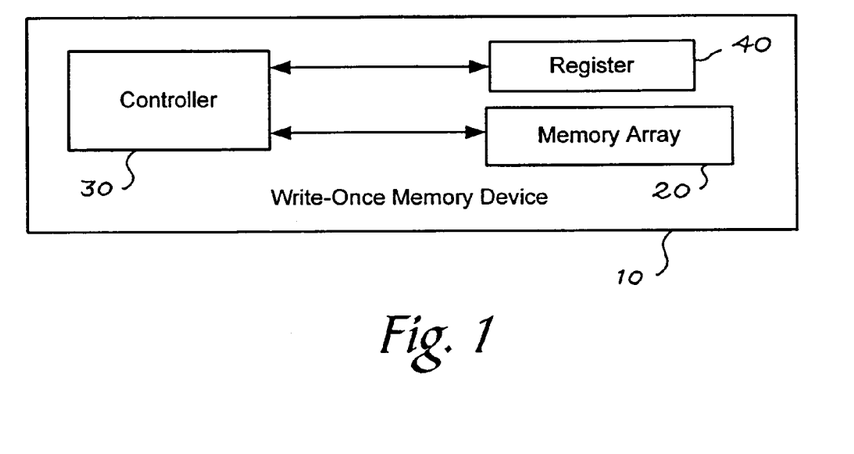
FIG. 1 is an illustration of a write-once memory device of a preferred embodiment.

Turning now to the drawings, FIG. 1 is an illustration of a write-once memory device 10 of a preferred embodiment. As shown in FIG. 1, the write-once memory device 10 includes a memory array 20 comprising a plurality of write-once field-programmable memory cells. The write-once memory device 10 also includes a memory array controller 30 that controls read and write operations to and from the memory array 20. The controller 30 can be entirely or partly formed as an array of CMOS gates on the same substrate that supports the memory array 20. The write-once memory device 10 also includes a register 40, which can be separate from the controller 30 (as shown in FIG. 1) or integrated with the controller 30.

A field-programmable memory cell is a memory cell that is fabricated in an initial, un-programmed digital state and can be switched to an alternative, programmed digital state at a time after fabrication of the memory cell. For example, the original, un-programmed digital state can be identified as the Logic 0 state, and the programmed digital state can be identified as the Logic 1 state. Because the memory cells are write-once, an original, un-programmed digital state of a memory cell (e.g., the Logic 0 state) cannot be restored once switched to a programmed digital state (e.g., the Logic 1 state). While a conventional two-dimensional memory array can be used, it is preferred that the memory array 20 be a three-dimensional memory array, such as those described in the following patent documents, each of which is hereby incorporated by reference: U.S. Pat. Nos. 6,034,882 and 5,835,396 and U.S. patent application Ser. Nos. 09/638,428; 09/638,334; 09/727,229; 09/638,439; 09/638,427; 09/638,334; 09/560,626; and 09/662,953. As discussed in those documents, three-dimensional memory arrays provide important economies in terms of reduced size and associated reductions in manufacturing cost. While this write-once memory device 10 takes the form of a solid-state memory device (i.e., a memory device that responds to electrical read and write signals to cause digital information to be read from and stored in a memory array of the device), other types of memory devices can be used, such as optical memory devices (e.g., CD ROMs). Accordingly, the claims should not be read as requiring a specific type of write-once memory device (e.g., solid-state or optical) or specific type of memory array (e.g., two dimensional or three-dimensional) unless explicitly recited therein.

Figure 2:
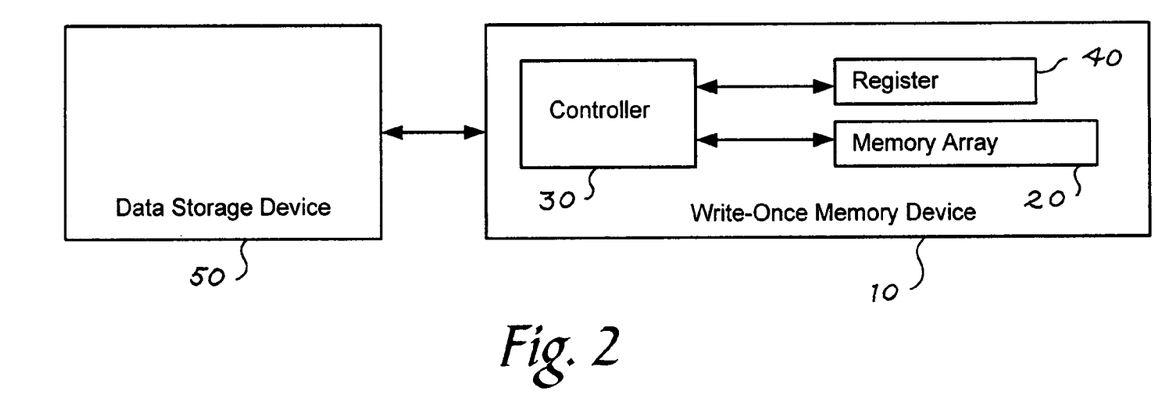
FIG. 2 is an illustration of a write-once memory device of a preferred embodiment releasably coupled with a data storage device.

In this preferred embodiment, the memory device 10 takes the form of a compact, handheld unit, such as a memory card or stick. The memory device 10 further comprises an external electrical connector (not shown) and is modular in the sense that it can be easily connected to and disconnected from a device having a mating electrical connector. For example, as shown in FIG. 2, the memory device 10 can be connected to a data storage device 50. As used herein, the terms "connected to" and "coupled with" are intended broadly to cover elements that are connected to or coupled with one another either directly or indirectly through one or more intervening components. Also as used herein, the term "data storage device" (or "authoring device") is intended to broadly refer to any device that can field-program digital data into the memory array 20 of the memory device 10. The data storage device can itself contain or create the digital data or can retrieve the digital data from another location. Examples of data storage devices include, but are not limited to, consumer devices such as a digital audio player, a digital audio book, an electronic book, a digital camera, a game player, a general-purpose computer, a personal digital assistant, a portable telephone, a printer, and a projector. "Digital data" can take any form, such as digital music, digital audio (e.g., voice/speech), digital video, at least one digital still image, a sequence of digital images, digital books, digital text (e.g., news or driving directions), a digital map, games, software, or any combination thereof. It should be noted that a data storage device can also read digital data stored on the write-once memory device 10. For example, a digital camera can both store digital images acquired by the camera and read digital images stored in the write-once memory device 10 for display on the camera's liquid crystal display.

Figure 3:
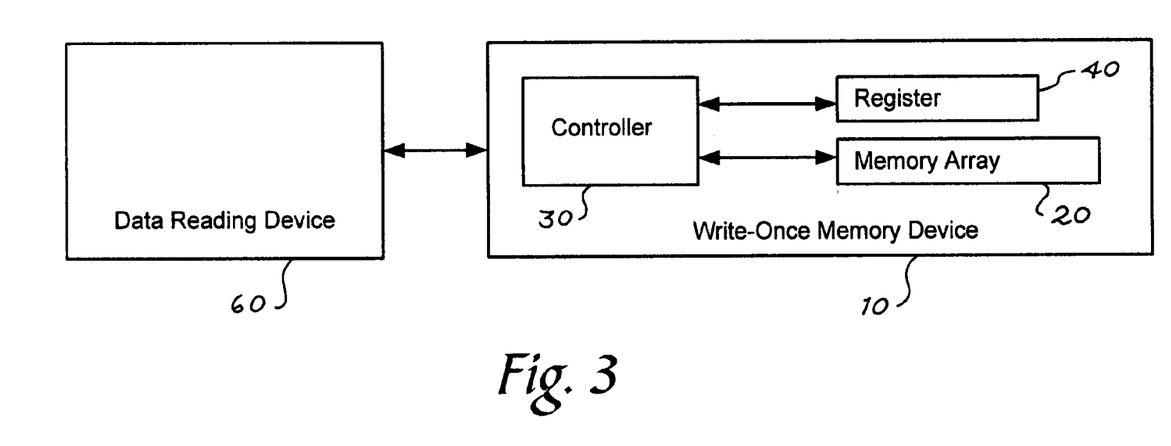
FIG. 3 is an illustration of a write-once memory device of a preferred embodiment releasably coupled with a data reading device.

After the data storage device stores digital data in the write-once memory device 10, the memory device 10 can be disconnected from the data storage device 50 and connected to a data reading device 60 (see FIG. 3). The term "data reading device" (or "reading device") is intended to broadly refer to any device that can read digital data stored in the memory array 20 of the memory device 10. Examples of data reading devices include, but are not limited to, consumer devices such as a digital audio player, a digital audio book, an electronic book, a digital camera, a game player, a general-purpose computer, a personal digital assistant, a portable telephone, a printer, and a projector. In addition to reading data, a data reading device can also write data in the memory device 10.

Figure 4:
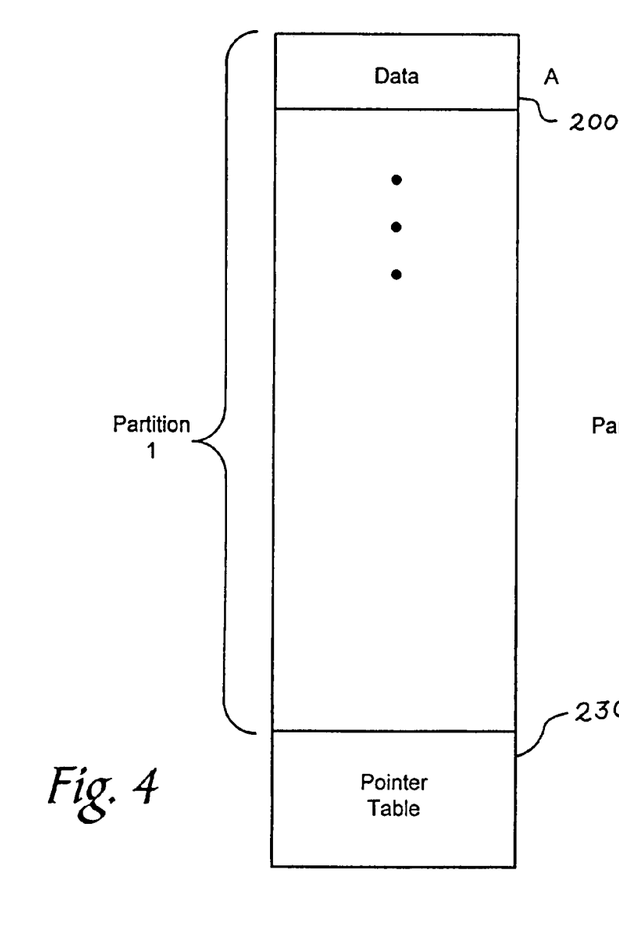
FIG. 4 is an illustration of a logical organization of a memory array after data is stored in a write-once memory device of a preferred embodiment.
Figure 5:
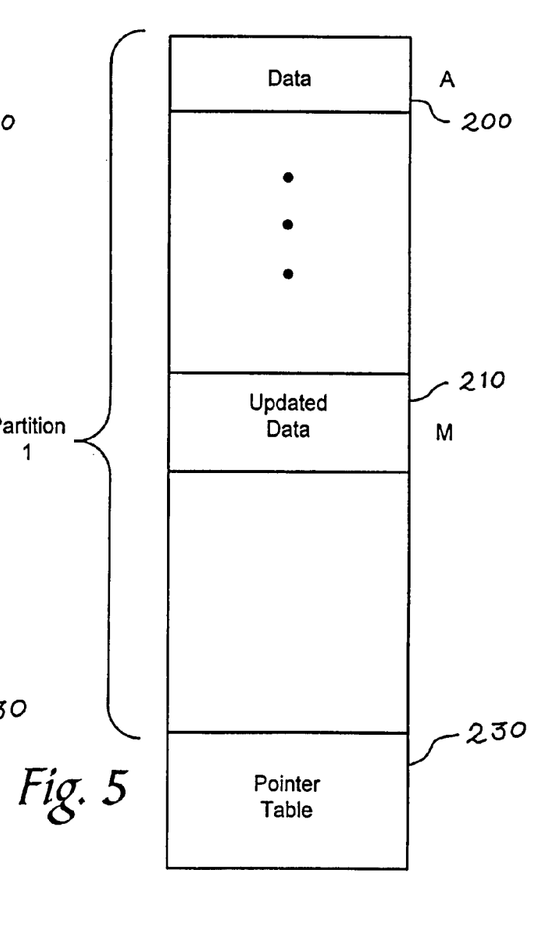
FIG. 5 is an illustration of a logical organization of a memory array after updated data is stored in a write-once memory device of a preferred embodiment.

Turning again to the drawings, FIGS. 4 and 5 are illustrations of the memory array 20. The memory array 20 in FIGS. 4 and 5 has only a single partition to simplify this example. It should be noted that more than one partition can be used. Data is stored in the memory array 20 after the memory device 10 is connected with a data storage device 50. In operation, the data storage device 50 sends data to the controller 30 of the memory device 10, which stores the data 200 in an available memory location in the memory array 20. As shown in FIG. 4, the data 200 is stored in memory address A. Consider the situation where an update to the data 200 ("updated data") is to be stored. If the memory device 10 had re-writeable memory cells, the updated data could be written into address A. However, since memory cells of the memory device 10 are write-once, the updated data cannot be written into memory address A, and the updated data needs to be stored in another memory location. In one embodiment, the controller 30 finds an available set of memory cells in the memory array 20 and stores the updated data therein. As shown in FIG. 5, the updated data 210 is stored at address M. In this way, the storage of updated data is redirected from an occupied location in the memory array 20 (address A) to an unoccupied location in the memory array 20 (address M).

Data traffic redirection may also be needed when a data reading device 60 tries to read the updated data. If the data reading device 60 expects the updated data to be stored at address A and sends a request to read address A, the original data (not the updated data) will be returned to the data reading device 60. To redirect data traffic so that the updated data (instead of the original data 200) will be returned to the data reading device 60, it is preferred that a pointer to the updated data be stored in the memory array 20. In this example, a pointer to address M would be stored in the memory array 20. When the data reading device 60 sends a request to read address A, the controller 30 reads address M (the address indicated by the pointer) and returns the updated data to the data reading device 60—even though the data reading device 60 sent a request for the data stored at address A.

Figure 6:
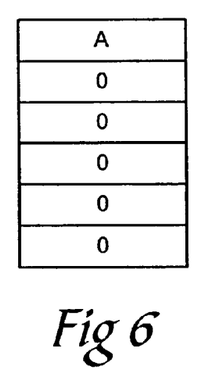
FIG. 6 is a first illustration of a pointer table of a preferred embodiment.
Figure 7:
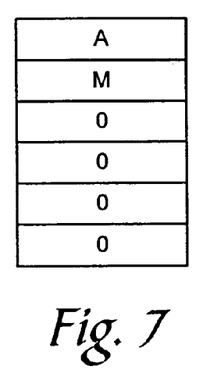
FIG. 7 is a second illustration of a pointer table of a preferred embodiment.
Figure 8:
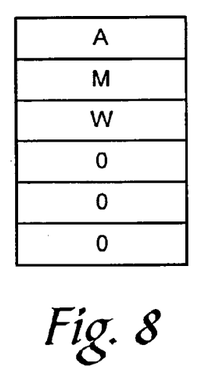
FIG. 8 is a third illustration of a pointer table of a preferred embodiment.

Pointers can be stored in the memory array 20 (or in another portion of the memory device 10) in any suitable fashion. In one preferred embodiment, pointers are stored in a table 230 in the memory array 20. FIGS. 6–8 provide an illustration. As shown in FIG. 6, when data is written into address A, a pointer to address A is stored in the table 230. If updated data is later stored at address M, a corresponding pointer is stored in the table 230, as shown in FIG. 7. Similarly, if updated data is later stored at address W, a pointer to address W is stored in the table following the previously-stored pointer to address M, as shown in FIG. 8. As shown in FIGS. 4 and 5, the table 230 is preferably stored in a portion outside of the partition so that that user data cannot be written into the table 230 and so that pointers cannot be "obliterated" by the user. (The "obliterate" function, which makes previously-stored data difficult or impossible to read by overwriting at least a portion of the stored data with a destructive pattern, is described in U.S. patent application Ser. No. 09/638,439, which is assigned to the assignee of the present invention and is hereby incorporated by reference.) Alternatively, the portion 230 can be stored as a reserved or read-only file within the partition that can be written into only when the controller 30 is in a special mode. Of course, other alternatives are possible. It is also preferred that a pointer be written after (not before) data is stored in the memory array 20. In this way, if a power loss occurs during a write operation, the last-stored pointer would point to previously-written data instead of an empty (or partially written) set of memory cells.

When the memory device 10 is connected to a data reading device 60, the memory device 10 is powered-up, and circuitry in the controller 30 queries the table 230 to find the last valid entry. (This can also occur in response to a commanded device reset operation.) To find the current pointer, the controller 30 preferably identifies the last line of written data by locating the first line of unwritten memory cells. This and other temporal-to-spatial mapping techniques that can be used to find the most-recent pointer are described in U.S. patent application Ser. No. 09/748,589, which is assigned to the assignee of the present application and is hereby incorporated by reference. The controller 30 then stores the current pointer in the memory device's register 40 (e.g., the memory device's RAM). This stored address will be used when any device sends a request to read address A. In this way, all subsequent requests for data stored in address A are redirected to the location indicated by the pointer, which stores the updated data. Accordingly, updated data is returned to the data reading device 60 even though it was not stored at the address expected by the data reading device 60 (address A).

It should be noted that the functionality described above can be distributed among the data storage device 50, the memory device 10, and the data reading device 60 in any desired manner. In one preferred embodiment, the functionality resides solely in the memory device 10. For example, the controller 30 of the memory device 10 can direct the storage of updated data to an available location in the memory array 20 and store a pointer to the updated data after it is written. The controller 30 can also retrieve the pointer during power-up of the memory device 10 and be responsible for returning the updated data stored in the memory location indicated by the pointer in response to a read address A command from the data reading device 60. With this implementation, no hardware or software adjustments would be needed in either the data storage device 50 or the data reading device 60. To lower the cost and complexity of the memory device 10, some of the tasks can be distributed between the memory device 10 and the hardware and/or software of the data storage device 50. For example, the data storage device 50 (instead of the controller 30) can be responsible for storing the updated data in an available location in the memory array 20 and storing a pointer to the updated data in the table 230. With either of these implementations, no modification is needed to the data reading device 60, and the process of redirecting the request for updated data is completely hidden from the data reading device 60. However, if desired, some of these tasks can be distributed to the data reading device 60 as well. For example, hardware and/or software of the data reading device 60 (instead of the controller 30 of the memory device 10) can be responsible for retrieving the stored pointer and sending a read request designating the address indicated by the stored pointer instead of address A.

Instead of storing pointers in a table, redirection of overwritten data can be determined at the level of the smallest grouping of data allowed by the memory device's buffer allocation scheme. Typically, this is referred to as a sector of data based on the nomenclature used in conventional disk-based systems. In this embodiment, the memory array of the write-once storage device is constructed in such a fashion to allow two extra fields of information to be stored in association with an amount of stored user data. As shown in the memory array of FIG. 9, the two extra fields indicate a write state 500 and an address of an alternate data location 510. When a write buffer passes data to the write-once memory device, an address chain sequencer 520, which can be implemented in the memory device, queries the associated write state field 500. The write state field can include one of the states set forth in Table 1 below.

TABLE 1

Figure 9:
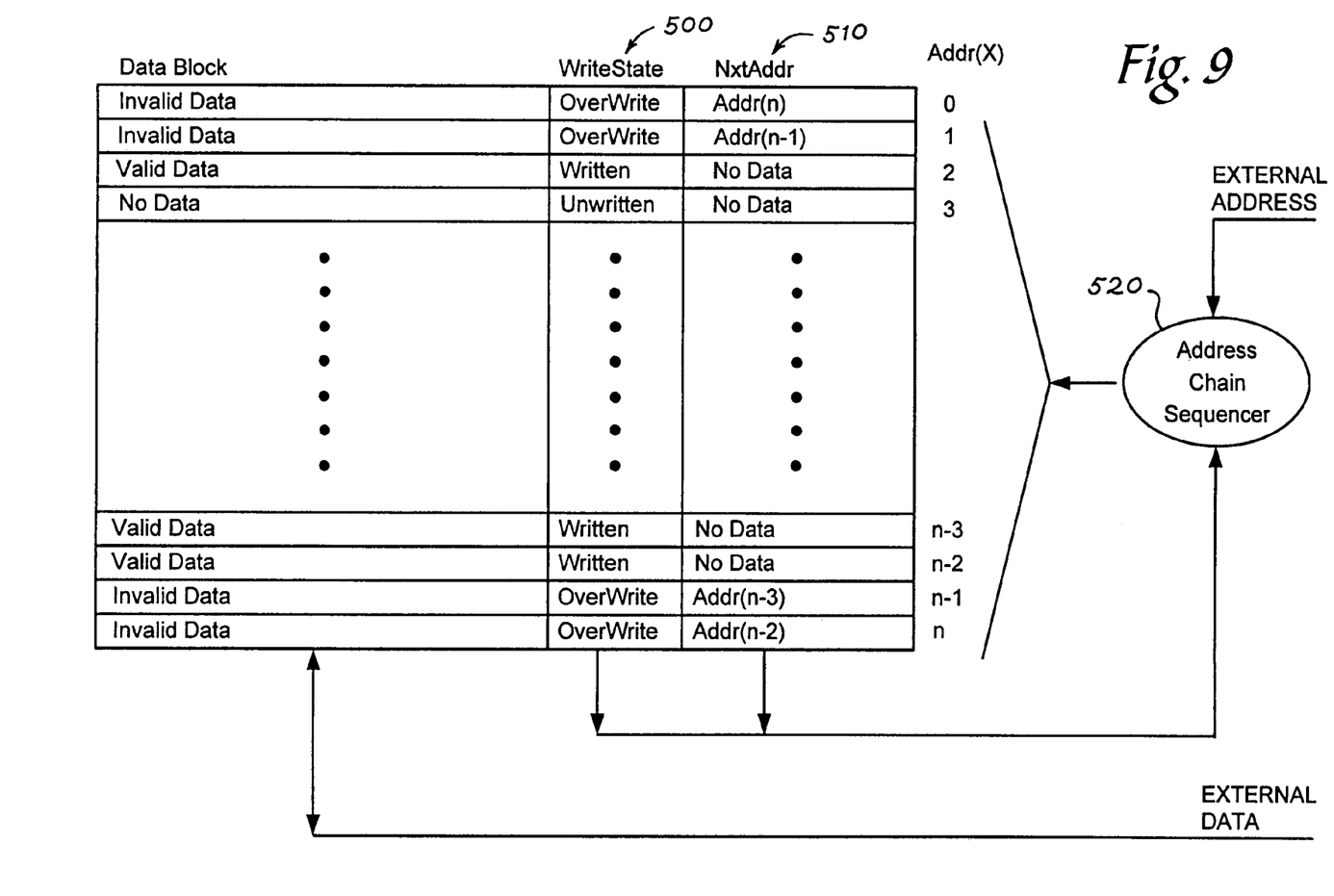
FIG. 9 is an illustration of a memory array of a preferred embodiment storing a write state and an address of an alternate data location.

| State | WriteState Enumeration Description |
|---|---|
| UnWritten | Indicates that this section of the device is able to accept data. |

TABLE 1-continued

| State | WriteState Enumeration Description |
|---|---|
| Written | Indicates that this section of the device is holding valid written data. |
| OverWritten | Indicates that this section of the device has been overwritten and that the new valid data lies at the address indicated by the NxtAddr field. |

The initial state of the WriteState sideband fields is UnWritten. When a block of data is sent to a sector address in the UnWritten state, the data is allowed to be stored at that address, and the WriteState sideband field is transitioned to the Written state. The next write to the same sector address (now in a Written state) will cause that sector to become invalidated and the new data to be redirected to a sector in the UnWritten state. The transition from Written to OverWritten involves several related actions. The controller 30 finds the next sector marked UnWritten and deposits the sector data at that location. The WriteState sideband field of the alternate location is then updated to Written. In addition, the address of this alternate location is placed in the NxtAddr sideband field of the detected overwrite, and its WriteState sideband field is simultaneously be updated to OverWritten. In this manor, multiple overwrites of a given address will form a chain of addresses terminating in the last data update received. In order to mitigate the issues resulting in software updates to addresses already taken by the controller 30 for re-direction, all candidates for over-write sectors are preferably kept in an area of memory inaccessible to the external device supplying data. As with the other preferred embodiments described above, the functionality described with respect to this preferred embodiment can be distributed among the data storage device 50, the memory device 10, and the data reading device 60 in any desired manner.

Figure 10:
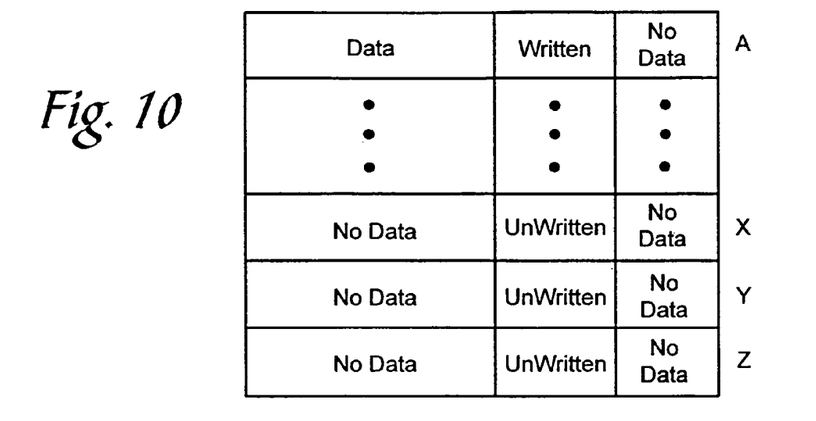
FIGS. 10–12 are illustrations of a memory array of a preferred embodiment storing a write state and an address of an alternate data location.
Figure 11:
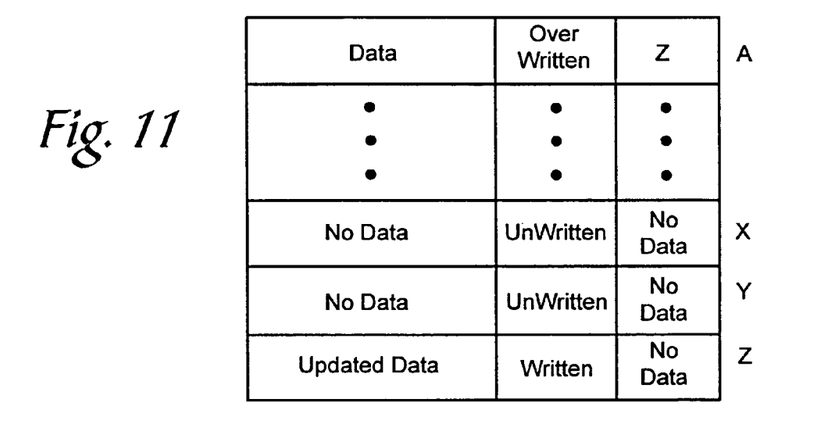
Figure 12:
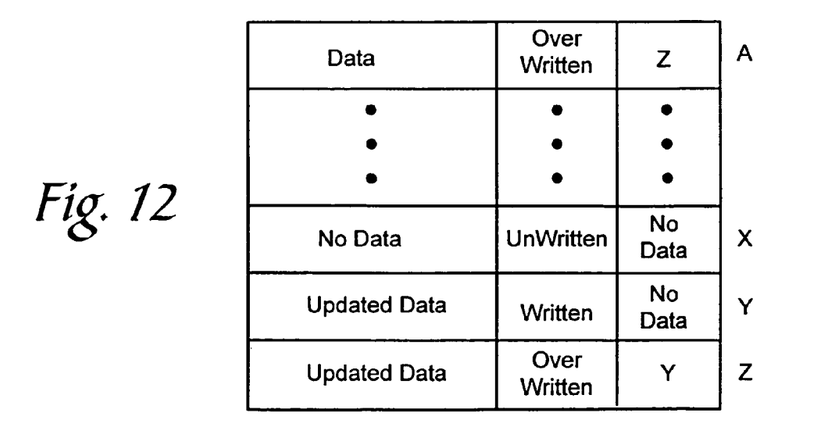

FIGS. 10–12 will be used to illustrate the operation of this preferred embodiment. In FIG. 10, data is written at address A. Because valid data is written into this sector, the WriteState field is "Written," and the NxtAddr field contains no data. When updated data is to be stored in the memory array, the controller 30 prevents the updated data from overwriting the data stored in address A and stores the updated data in an available location in the memory array. As shown in FIG. 11, the updated data is stored at address Z. The controller 30 also changes the WriteState field of address A to "OverWritten" and writes address Z into the NxtAddr field. When the memory device is read by a data reading device, a read address A command will be sent to the controller 30. In response to this command, the controller 30 examines address A and finds that the data stored therein is designated as overwritten and that current, valid data is stored at address Z. The controller 30 then returns the updated data stored at address Z to the data reading device 60 instead of the out-of-date data stored at address A. As shown in FIG. 12, when updated data is later to be stored in the memory array, the controller 30 stores the updated data in an available location in the memory array (here, address Y). The controller 30 also changes the WriteState field of address Z to "OverWritten" and writes address Y into the NxtAddr field. In response to a read address A command from a data reading device, the controller 30 examines address A and finds that the data stored therein is designated as overwritten and that current, valid data is stored at address Z. When the controller examines address Z, it finds that the data stored therein is also designated as overwritten and is directed to address Y. As shown by this example, the controller "walks the chain" from address A to address Z to address Y to find the updated data.

Figure 13:
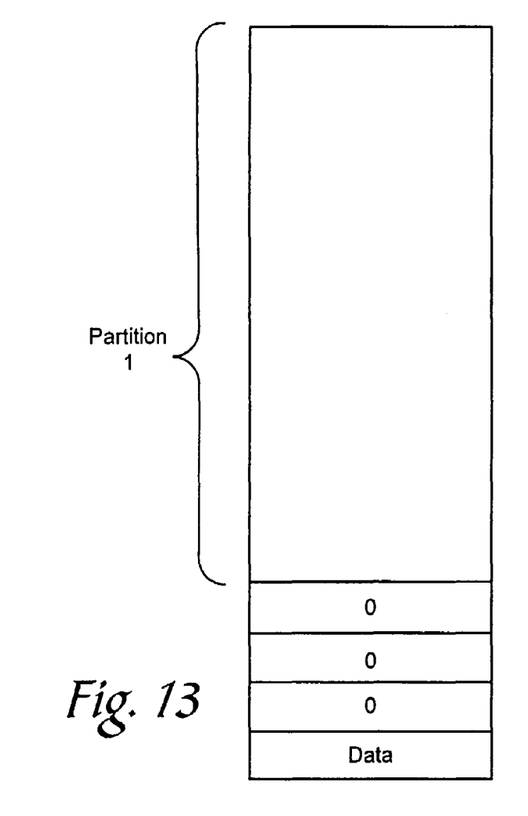
FIGS. 13–14 are illustrations of a memory array of another preferred embodiment.
Figure 14:
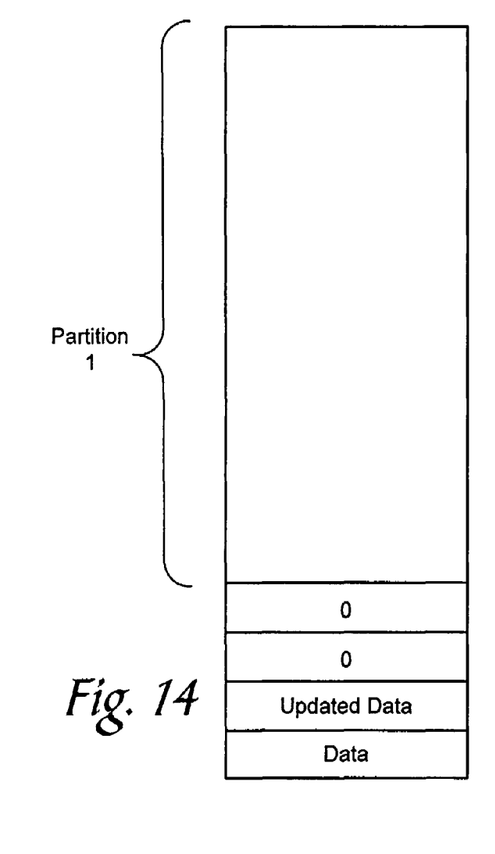

In the preferred embodiments described above, a pointer was stored in a table or in a field associated with a set of memory cells for storing data (e.g., a sector of data). It should be noted that the pointer can be stored in any other suitable location. Additionally, data can be redirected without the use of a stored pointer. This alternative will be illustrated in conjunction with FIGS. 13 and 14. In FIG. 13, data of a fixed size is stored in an area outside of a partition in a memory array. In this embodiment, the data is stored at the bottom of this area (the "data update portion"). The data can also be stored in an area within the partition. FIG. 14 shows updated data stored in the next available memory location preceding the previously-stored data. When a data reading device 60 sends a command to the memory device 10 to read the addresses that it expects to find the data, the controller 30 locates the last line of unwritten memory cells in the data update portion. Because both the data and the updated data are of a fixed, known size, the controller reads the following X lines, where X is a fixed offset determined by the size of updated data. The updated data stored in those lines is then returned to the data reading device 60.

Figure 15:
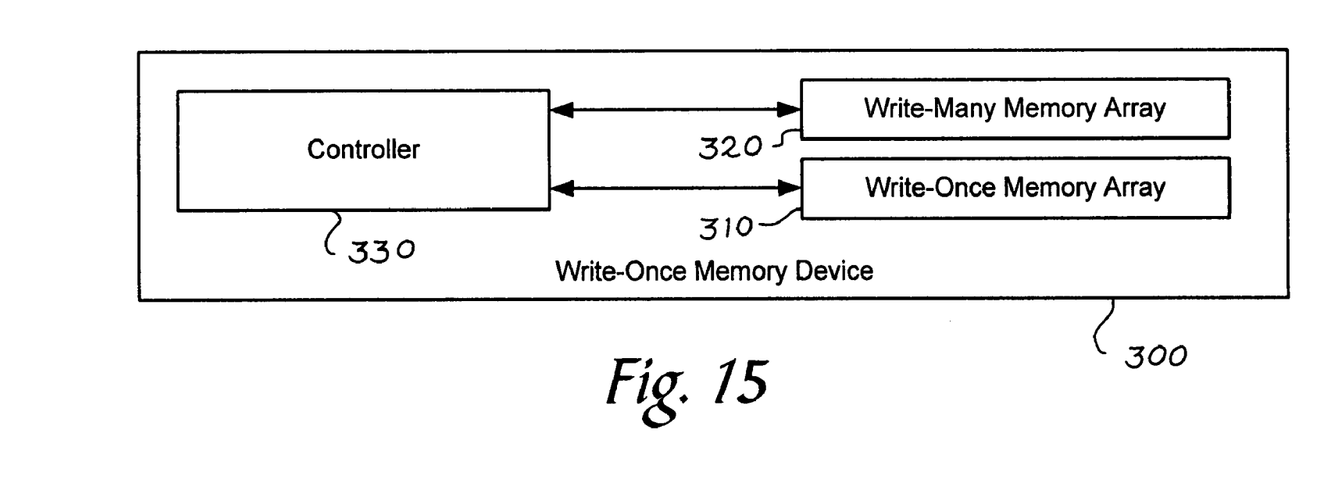
FIG. 15 is an illustration of a memory device of a preferred embodiment comprising a write-once memory array and a write-many memory array.

In the preferred embodiments described above, data that needed to be updated was stored in a memory array of write-once memory cells. In another embodiment, which is shown in FIG. 15, a write-once memory device 300 is provided with both a write-once memory array 310 and a non-volatile write-many memory array 320. Although shown as a separate component, the write-many memory array 320 can be integrated with the write-once memory array 310 or with the controller 330. The write-many memory array 320 can take the form, for example, of an electrically-erasable programmable read-only memory, such as Flash memory. In operation, hardware and/or software in a data storage device (or the controller 330 in the write-once memory device 300) would stored data that would later need updating in the write-many memory array 320 instead of (or in addition to) the write-once memory array 310. Accordingly, memory cells that store the data can be re-written with the updated data. When a data reading device sends a read command for the addresses storing the data, the controller 330 reads those addresses from the write-many memory array 320 instead of the write-once memory array 310. Alternatively, hardware and/or software in the data reading device can send a command to read the addresses from the write-many memory array 320 instead of the write-once memory array 310.

Figure 16A:
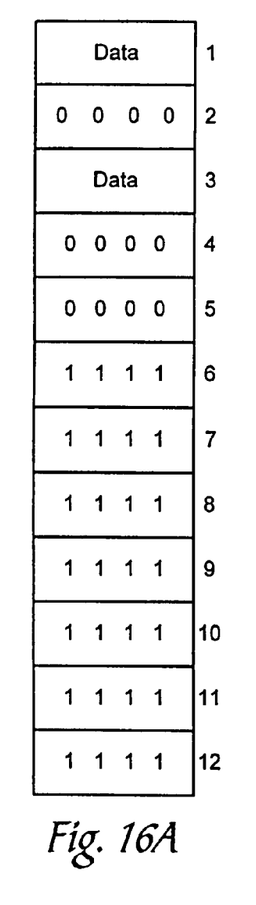
FIGS. 16A and 16B are illustrations of a memory array of a preferred embodiment storing data.
Figure 16B:
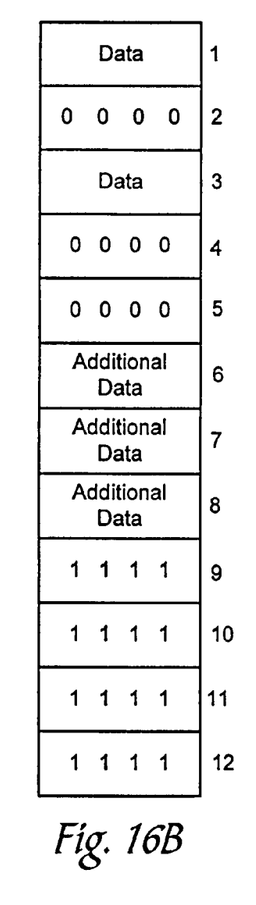

In some applications, a data storage device and/or a data reading device requires one or more 0s before, between, or after stored data. For example, a string of 0s can represent the end of a file or can represent unallocated memory cells in the middle of a file. If Logic 0 is the initial, un-programmed digital state of a memory cell in a memory array, additional data can later be written into these "empty" memory cells. However, if Logic 1 is the initial, un-programmed digital state, "empty" memory cells are created by switching the initial Logic 1 state to Logic 0, and those memory cells cannot later be switched back to 1s to store additional data. This problem is also encountered when memory cells have Logic 0 as their initial digital state and "empty" memory cells are designated as Logic 1. Accordingly, additional memory space must be used to store additional data. The memory array of FIGS. 16A and 16B provides an illustration of this problem. In FIG. 16A, data is stored at address 1 and 3. A string of 0s is stored at address 2 to represent unallocated memory cells in the middle of the file, and a string of 0s is stored at address 4 and 5 to represent the end of the file. If Logic 0 were the initial, un-programmed digital state of the memory array, additional data could be stored in the "empty" memory cells at address 2, 4, and 5. However, because these memory cells are permanently switched to a programmed Logic 0 state, additional data cannot be written into these memory cells and must be stored in another location of the memory array. As shown in FIG. 16B, additional data is stored at address 6, 7, and 8 instead of address 2, 4, and 5.

Figure 17A:
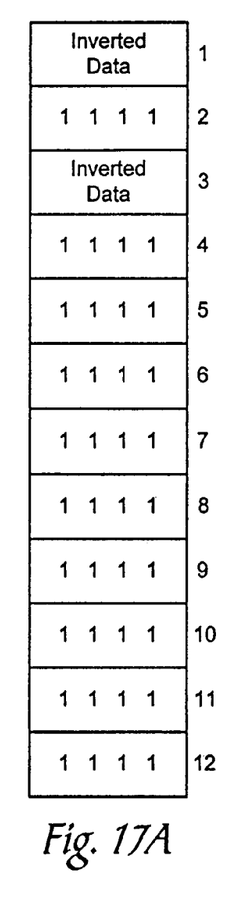
FIGS. 17A and 17B are illustrations of a memory array of a preferred embodiment storing inverted data.
Figure 17B:
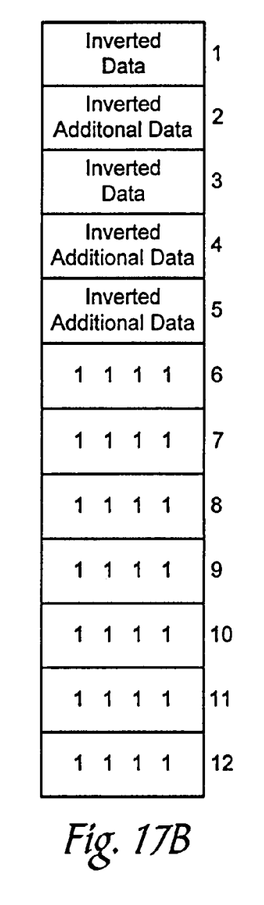

In order to use "empty" memory cells to store additional data, it is preferred that the bits representing data be inverted before they are stored in the memory array. In this way, Logic 1 bits are stored as Logic 0 bits, and Logic 0 bits are stored as Logic 1 bits. Because Logic 1 is the initial state of the memory array, Logic 1 bits are "stored" by not switching the initial state of a memory cell to Logic 0. Accordingly, some or all of these memory cells can later be switched to the Logic 0 state to store additional data in the "empty" cells. FIGS. 17A and 17B illustrate how this approach can be used with the previous example. As shown in FIG. 17A, the data bits are inverted and stored as inverted data, and the 0s representing "empty" memory cells are inverted and stored as 1s. Since the initial digital state of the memory cells is Logic 1, the "empty" memory cells are left in the un-programmed state. Accordingly, some or all of these memory cells can later be programmed as 0s to store additional data (in an inverted form), as shown in FIG. 17B. By inverting data bits, this preferred embodiment essentially redefines the value of the unwritten bit of the memory array as Logic 0 and conserves memory space by storing additional data in "empty" memory cells instead of using additional memory cells. In this way, the memory cells at address 6, 7, and 8 are not wasted by storing additional data that could be stored in the "empty" memory cells at address 2, 4, and 5. When data bits are read from the memory array, they are inverted to provide the data bits in their original, non-inverted configuration.

Figure 18:
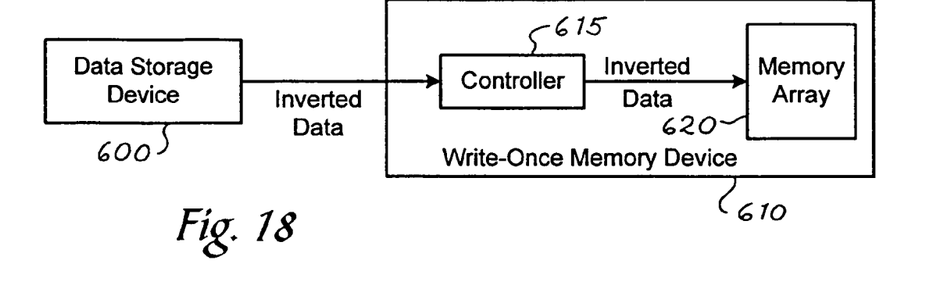
FIG. 18 is an illustration of a preferred embodiment in which a data storage device inverts data bits to be stored in a memory array.
Figure 19:
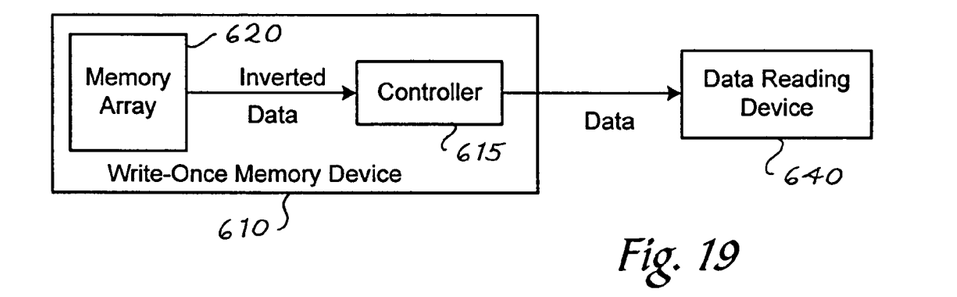
FIG. 19 is an illustration of a preferred embodiment in which a controller of a write-once memory device inverts data bits read from a memory array.

Hardware and/or software in a data storage device, data reading device, and/or write-once memory device can be responsible for inverting data bits to be stored in or read from a write-once memory array. FIGS. 18–21 illustrate various configurations. In FIG. 18, a data storage device 600 is coupled with a write-once memory device 610 comprising a controller 615 and a memory array 620 of write-once memory cells. In this embodiment, the data storage device 600 is responsible for inverting data bits to be stored in the memory array 620, and the controller 615 is responsible for inverting inverted data bits read from the memory array 620. Accordingly, when the data storage device 600 sends inverted data bits to the write-once memory device 610, the controller 615 merely stores the inverted data bits in the memory array 620. However, when the stored data bits are read by a data reading device 640 coupled with the write-once memory device 610 (see FIG. 19), the controller 615 inverts the data bits to provide the data to the data reading device 640 in its original, non-inverted configuration. The controller 615 preferably includes an inverter gate to perform the inverting operation. Because the controller 615 of the memory device 610 is responsible for inverting the inverted data bits back to their original, non-inverted configuration, the write-once memory device 610 is compatible with data reading devices that are not aware that data is stored in an inverted form in the memory array. This provides a high degree of interoperability with existing playback devices.

Figure 20:
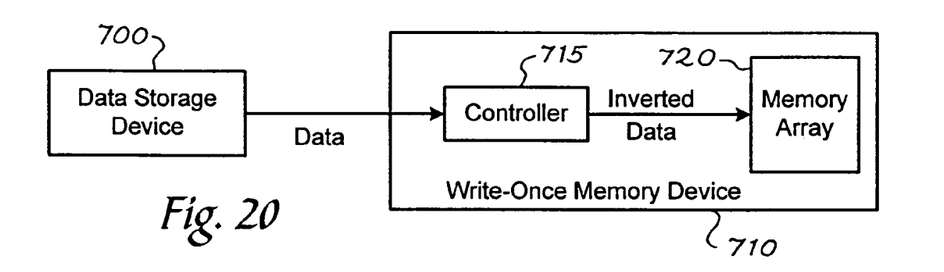
FIG. 20 is an illustration of a preferred embodiment in which a controller of a write-once memory device inverts data bits to be stored in a memory array.
Figure 21:
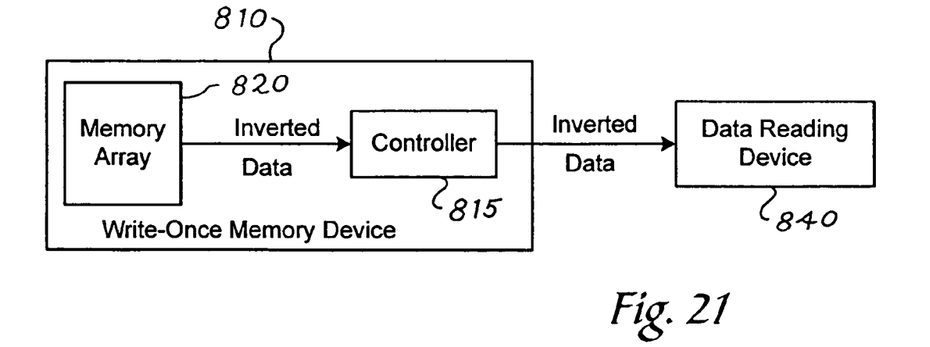
FIG. 21 is an illustration of a preferred embodiment in which a data reading device inverts data bits read from a memory array.

In the alternate embodiment shown in FIG. 20, the controller 715 of the write-once memory device 710 (instead of the data storage device 700) is responsible for inverting data bits to be stored in the memory array 720. Accordingly, in this embodiment, the controller 715 inverts data bits during a write operation instead of or in addition to inverting data bits during a read operation. In the alternate embodiment shown in FIG. 21, the data reading device 840 (instead of the controller 815 of the memory device 810) is responsible for inverting data bits read from the memory array 820.

In the embodiments described above, all data bits read from and stored in the memory array were inverted. This results in a simplified controller, data storage device, and/or data reading device because all bits written to and read from the memory array are inverted. In an alternate embodiment, the memory array comprises at least two sections, and data bits stored in one section are inverted, while data bits stored in the other section are not. The data storage device and/or the controller of the write-once memory array can be responsible for inverting selected data bits and storing them in the appropriate section of the memory array. Similarly, the data reading device and/or the controller of the write-once memory array can be responsible for inverting the data bits read from the section of the memory array storing inverted data bits, while allowing data bits stored in the other section of the memory array to be read without inversion.

U.S. patent application Ser. No. 09/877,719, filed Jun. 8, 2001, contains embodiments that can be used with any of the embodiments described herein and is hereby incorporated by reference.

It is intended that the foregoing detailed description be understood as an illustration of selected forms that the invention can take and not as a definition of the invention. It is only the following claims, including all equivalents, that are intended to define the scope of this invention. Finally, it should be noted that any aspect of any of the preferred embodiments described herein can be used alone or in combination with one another. For example, the embodiments in which data bits are inverted can be used alone or in combination with the embodiments in which data is redirected.

What is claimed is:

1. A method for storing and reading data in a write-once memory array, the method comprising:
   (a) inverting a plurality of bits representing data to be stored in a write-once memory array irrespective of a number of logic one bits in the plurality of bits;
   (b) storing the inverted plurality of bits in the write-once memory array;
   (c) reading the inverted plurality of bits from the write-once memory array; and
   (d) inverting the inverted plurality of bits read from the write-once memory array.

2. The method of claim 1, wherein act (a) is performed by a data storage device coupled with a memory device comprising the write-once memory array.

3. The method of claim 2, wherein the data storage device comprises a device selected from the group consisting of a digital audio player, a digital audio book, an electronic book, a digital camera, a game player, a general-purpose computer, a personal digital assistant, a portable telephone, a printer, and a projector.

4. The method of claim 1, wherein act (a) is performed by a controller of a memory device comprising the write-once memory array.

5. The method of claim 1, wherein act (d) is performed by a data reading device coupled with a memory device comprising the write-once memory array.

6. The method of claim 5, wherein the data reading device comprises a device selected from the group consisting of a digital audio player, a digital audio book, an electronic book, a digital camera, a game player, a general-purpose computer, a personal digital assistant, a portable telephone, a printer, and a projector.

7. The method of claim 1, wherein act (d) is performed by a controller of a memory device comprising the write-once memory array.

8. A memory device comprising:
   a write-once memory array storing a plurality of bits representing data; and
   a controller coupled with the write-once memory array and operative to invert the plurality of bits representing the data irrespective of a number of logic one bits in the plurality of bits when the plurality of bits is read from the write-once memory array.

9. The memory device of claim 8, wherein the controller is further operative to invert a plurality of bits representing data to be stored in the write-once memory array.

10. The memory device of claim 8, wherein the memory device comprises a solid-state memory device.

11. The memory device of claim 8, wherein the memory device comprises an optical memory device.

12. A method for redefining an initial, un-programmed digital state of a write-once memory array, the method comprising:
   (a) providing a write-once memory array comprising a plurality of write-once memory cells, the plurality of write-once memory cells comprising an initial, un-programmed digital state that can be switched to an alternative, programmed digital state; and
   (b) redefining the initial, un-programmed digital state of the plurality of write-once memory cells as the alternative, programmed digital state by storing bits in the plurality of write-once memory cells in an inverted form irrespective of a number of logic one bits in the plurality of bits.

13. The method of claim 12, wherein the initial, un-programmed digital state comprises Logic 1, and wherein the alternative, programmed digital state comprises Logic 0.

14. The method of claim 12, wherein the initial, un-programmed digital state comprises Logic 0, and wherein the alternative, programmed digital state comprises Logic 1.

15. The method of claim 1 or 12, wherein the write-once memory array comprises a three-dimensional memory array.

16. The method of claim 1 or 12, wherein the write-once memory array comprises a two-dimensional memory array.

17. The memory device of claim 8, wherein the write-once memory array comprises a three-dimensional memory array.

18. The memory device of claim 8, wherein the write-once memory array comprises a two-dimensional memory array.

19. The method of claim 1, wherein the plurality of bits are inverted even when a number of logic one bits in the plurality of bits does not exceed fifty percent of a total number of bits in the plurality of bits.

20. The memory device of claim 8, wherein the plurality of bits are inverted even when a number of logic one bits in the plurality of bits does not exceed fifty percent of a total number of bits in the plurality of bits.

21. The method of claim 12, wherein the controller is operative to invert the plurality of bits even when a number of logic one bits in the plurality of bits does not exceed fifty percent of a total number of bits in the plurality of bits.

* * * * *